United States Patent [19]

Yang

[11] Patent Number: 5,117,404
[45] Date of Patent: May 26, 1992

[54] METHOD FOR ESTABLISHING PROGRAM AND TIME OF THE REMOCON(REMOTE-CONTROLLER)

[75] Inventor: Byung-Hwan Yang, Suwon, Rep. of Korea

[73] Assignee: SamSung Electronics Co., Ltd., Suwon, Rep. of Korea

[21] Appl. No.: 387,533

[22] Filed: Jul. 31, 1989

[30] Foreign Application Priority Data

Dec. 31, 1988 [KR] Rep. of Korea .................. 88-18242

[51] Int. Cl.$^5$ .................. G04B 47/00; H04Q 1/00
[52] U.S. Cl. .................. 368/10; 340/825.69; 340/825.72
[58] Field of Search ............ 368/10, 82; 340/365 VL, 340/825.54, 825.55, 825.56, 825.69, 825.72; 358/194.1

[56] References Cited

U.S. PATENT DOCUMENTS

| | | |
|---|---|---|
| 4,139,864 | 2/1979 | Schulman . |
| 4,348,696 | 9/1972 | Beier . |
| 4,510,623 | 4/1985 | Bonneau et al. . |
| 4,670,747 | 6/1987 | Borras et al. . |
| 4,712,105 | 12/1987 | Kohler .................. 358/194.1 |
| 4,718,107 | 1/1988 | Hayes . |
| 4,745,397 | 5/1988 | Lagerbauer et al. ........... 358/194.1 |
| 4,746,919 | 5/1988 | Reitmeier .................. 358/194.1 |
| 4,769,643 | 9/1988 | Sogame .................. 358/194.1 |
| 4,825,200 | 4/1989 | Evans et al. .................. 358/194.1 |

Primary Examiner—Vit W. Miska
Attorney, Agent, or Firm—Robert E. Bushnell

[57] ABSTRACT

A method for establishing a program and time of a remocon having a remocon MICOM, characterized in that the time counting operation being performed is displayed on the LCD under the conditions that the initial time establishment is seconds, the functional key is OFF and time more than 20 seconds goes by after the mode key is ON, and while not under these conditions, the conventional key input is sent as the remocon data after decoding of the key input, and the mode key input is sent to the set as remocon data for mode-set after display the LCD through the established route of each program and time. A program and time of the set may be established in the simple way by monitoring the LCD of the remocon according to the present invention.

15 Claims, 3 Drawing Sheets

METHOD FOR ESTABLISHING PROGRAM AND TIME OF THE REMOCON(REMOTE-CONTROLLER)

BACKGROUND OF THE INVENTION

The present invention relates to a method for establishing a program and time of a remote controller (i.e., a ("remocon"), particularly to a method in which the program and time of the remocon are established, being seen by the attached liquid crystal display (LCD), and the established program and time are sent to the original VTR set, thereby establishing those of the VTR set.

In the past, in order to establish the program and time of the VTR with remocon, first the VTR set is turned on, and the user must establish the program and time of the VTR, watching display-characters on the screen, or operate manually the key of the VTR set.

Thus, the direct operation of the key is inconvenient and it is not found that the program and time are correctly established.

Also, in the prior method the program and time are established by watching on-screen characters, at first, the VTR set should be turned on, and the operation by remote control is therefore inconvenient.

SUMMARY OF THE INVENTION

The present invention has been made in consideration of this and has for one object to provide a method for establishing the program and time of the remocon, in which the established course of the program and time can be displayed by attaching the LCD to the remocon and the program and time of the original set are established by receiving that of the remocon when the desired program and time is completed.

Another object of the present invention is to provide the method in which the program and time established for the set can be performed, while watching only the LCD attached to the remocon without the operation of the key or on-screen characters since the LCD can display the established course of the program and time.

According to the present invention, there is provided a method for establishing the program and time of a remote controller having a microprocessor (i.e., a remocon MICOM) having remocon, characterized in that the time counting operation is performed being displayed on the LCD under the conditions that the initial time establishment is t1 seconds, the functional key is OFF and time more than t2 seconds goes by after the mode key is ON, and while not under these conditions, the conventional key input is sent as the remocon data after decoding of the key input, and mode key input is sent to the set as the remocon data for a mode-set after display on the LCD through the established route of each program and time.

BRIEF DESCRIPTION OF THE INVENTION

FIG. 1 is a block diagram of the present invention.
FIG. 2 is a main flow chart of the present invention.
FIGS. 3–5 are subroutines of the present invention.
FIG. 6 represents the sent data of the remocon.

DETAILED DESCRIPTION OF THE INVENTION

The present invention will be now described in more detail with reference to accompanying drawings.

Figure 1:
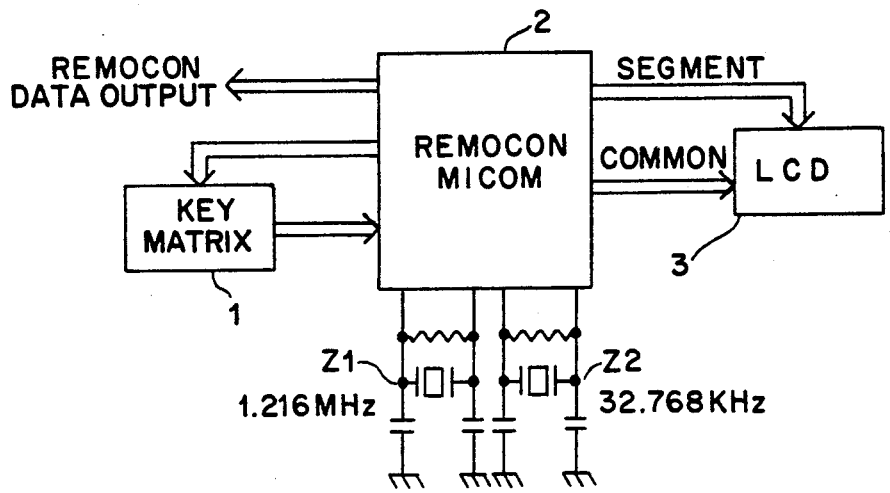

First, FIG. 1 represents the block diagram of the remocon with the LCD according to the present invention.

The remocon is constructed so that the clocks of the MICOM 2 for the main program and time are provided from the oscillators Z1 and Z2 of which have oscillating frequencies of 1.215 MHz and 32.768 KHz respectively, and the internal program the MICOM 2 is changed by pressing the key matrix 1, thereby establishing the program and time, with LCD 3 displaying the established program and time.

That is, after the program and time of the remocon is established by pressing the key matrix, the data of the remocon is sent to the original set, thereby establishing the program and time of the set. At this time, the established course is displayed on the LCD.

Thus, the user can establish and send the program and time of the remocon, watching the LCD3 attached to the remocon for establishing the program and time of the set.

Figure 2:
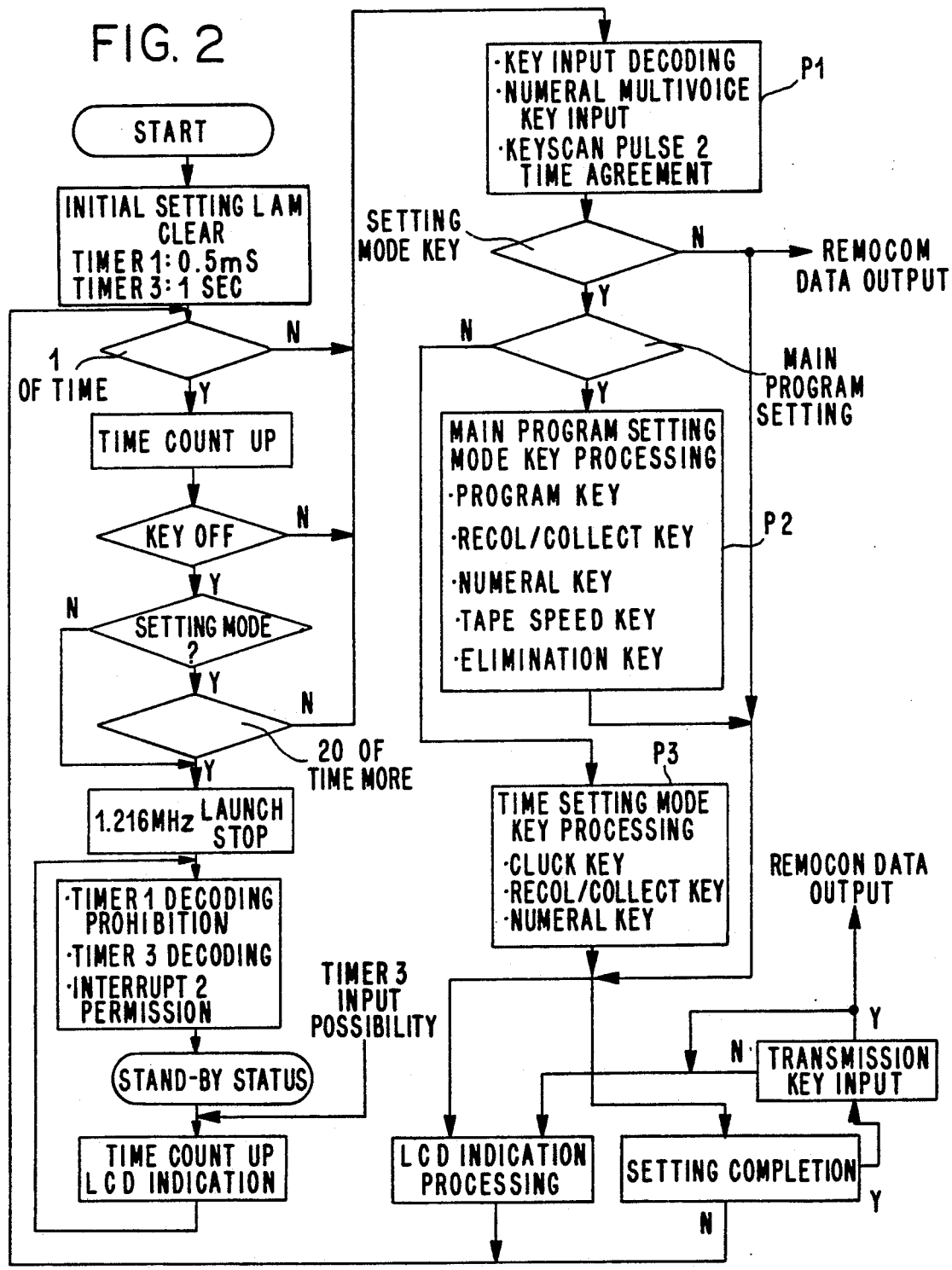

Now, the program for establishing the program and time in the MICOM 2 will be described with reference to the FIG. 2 which represents the main flow chart.

When the initial main program starts, the RAM inside the MICOM 2 for the remocon is cleared, and the subroutine timers (1) (see FIG. 3) 1 and 3 have periods of 0.5 milliseconds and 1 seconds, respectively. At this time, the period of (see FIG. 4) timer 1, 0.5 ms, is obtained from the frequency of the oscillator Z1, 1.216 $MH_3$ and that of the timer 3, 1 sec, is obtained from that of the oscillator Z2, 32.768 KHz.

By distinguishing between time 1 and time 3 in the initial starting state after clearing of the RAM, if timer 1, then the decoding routine P1 for key input is performed, while if timer 3, then the count-up routine of the time at first is performed. After counting up the time, if the functional key of the key matrix 1 is ON, then the decoding routine of the key-input is first performed, while if the functional key is OFF, then whether the establishment, or setting, mode for the main program is selected is determined and if not, then the time setting mode is performed.

When the establishment, or setting, mode for the main program is ON, then, whether time more than 20 seconds goes by or not, is determined after the final key-input. But, if not in the establishment mode, then the routine directly enters into the oscillation stop routine of the oscillator Z1.

Also, the key-input decoding routine P1 is performed before 20 seconds go by. If twenty seconds have expire, the oscillation stop routine is performed. The routine begins to count the period of 20 seconds from the final key-input.

As this, when the timer 1 is selected or time more than 20 seconds does not go by on the establishment mode, the key-input decoding routine P1 is performed. The key-input decoding routine P1 will be described later.

On the other hand, if the routine is not in the establishment mode, then only time is counted. Thus, the oscillation of oscillator Z1 is stopped and the routine in which the decoding of the timer 1 is stopped, while the decoding of timer 3 is performed, also the interrupt 2 routine which is permitted, is performed.

Afterwards, the routine is performed whereby timer 1 is not decoded, while the timer 3 is decoded, also the interrupt 2 is permitted, if enters the standby state, checking the input state of the timer 3. If shown in FIG.

Figure 4:
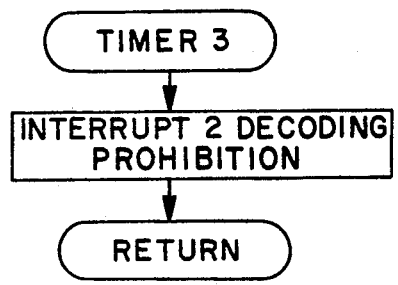

4 the subroutine of the timer 3 enters, then the subroutine shown in FIG. 4 is performed, while, if not, the counted time is displayed on the LCD.

Figure 3:
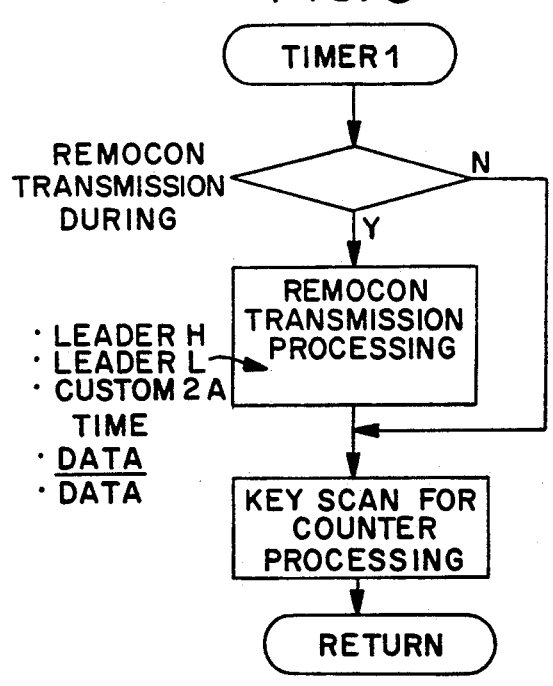
Figure 5:
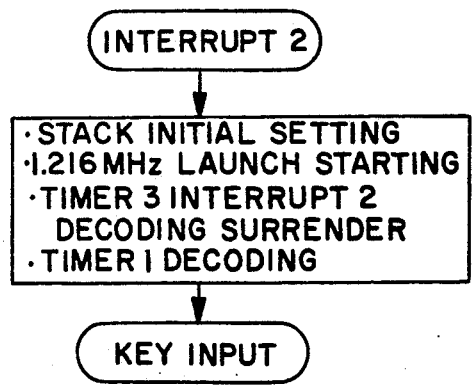

At this time, if the subroutine is that shown in FIG. 5, the interrupt 2, is performed, the oscillator Z1 begins to operate and the subroutine timer 1 as shown in FIG. 3 is performed. Thus, the subroutine timer 1 distinguishes whether on sending of the remocon data or not remocon data is sent. If on sending, the remocon data as shown in FIG. 6 is sent, while if not, the counter for key-scan operates. After that time, all modes before the subroutine interrupt 2 are performed. The LCD 3 of the remocon displays the counted time.

Also, in case that the initial subroutine time 1 is selected, or the functional key is pressed, or that time more than 20 seconds does not go by during the establishment mode, the operation of the key-input decoding routine P1 is to be described. That is, in the key-input decoding routine P1, whether the key-input is the conventional number key or the sound multiselection key, is checked by decoding the key-input. This check of the key-input is finished if the key-scan pulse is double coincided when key-input enters.

At this, after the key-input is decoded in the key-input decoding routine P1, then whether the key-input is for establishment mode or not is determined. If the key is for the establishment mode, then whether the key-input is for main program establishment mode is again determined.

But, if the key input is not for the establishment mode, then the key-input is the conventional key-input so that the remocon data is sent to the original set. That is, if the key-input decoded in the key-input decoding routine is not the establishment mode key but the conventional functional key, the key-input is sent directly to the set so that the corresponding operation is performed.

But, if the establishment mode setting key is used, either the main program establishment mode or the time establishment mode is again distinguished. In case of the main program establishment mode, the main program establishment routine P2 is performed, while in case of the time establishment mode, the time establishment routine P3 is performed.

In the main program establishment routine P2, the main program can be established by receiving the key-input such as the program key, the recall/correct key for the reset and correction, the number key, the speed key for the tape, and the removal key. The establishment course of the main program by each key is displayed on the LCD 3.

And in the time establishment routine P3, the time is established by the clock key, the number key, and the recall/correct key. Also, the time establishment operation is displayed on the LCD.

At this, in both routines, that is, the main program establishment routine P2 and the time established routine P3, the establishment courses are displayed on the LCD 3, also whether the establishment operation is finished or not is determined. If the establishment of the main program and time is not finished, then the operation as mentioned above is repeated.

While, when the establishment of both is finished, the transmission key-input is checked so that the data is sent to the original set in case that the transmission key-input is entered. At this time, the LCD displays the established course regardless of the transmission key-input.

As above, when the main program and time are established and are sent to the set, the sent remocon data for establishment of the main program and time is constructed differently than the conventional functional data as shown in FIG. 6.

Figure 6A:
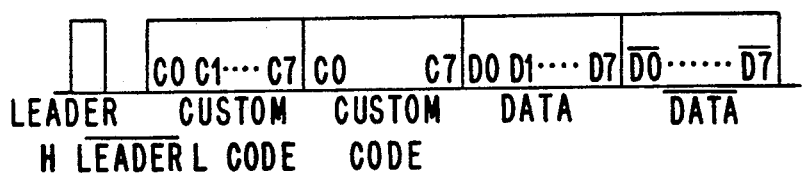
Figure 6B:
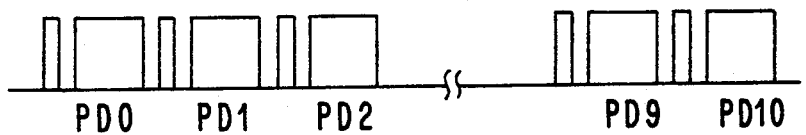
Figure 6C:
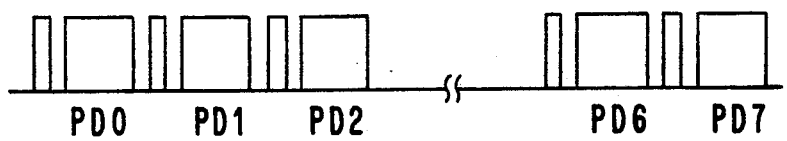

That is, the sent data of the conventional functional key is constructed as shown in FIG. 6(a), and the data for establishing the main program and time are constructed as shown in FIG. 6(b) and (c), respectively, where the establishment data is made up with many groups by regarding the conventional functional data of FIG. 6(a) as one group. Each group of the data for establishing the main program and time can be changed according to the establishment state, and the custom code of each group is identical with that of the conventional functional key.

As mentioned above, the present invention can establish simply the program and time of the set by sending the remocon data to the set after establishment of the remocon, and watching the displayed state on the LCD, where the data for establishing the main program and time are differently provided, and this different data is decoded in the original set for establishment of the set. Thus, the present invention is convenient for use, since the program and time of the set can be simply established by monitoring the LCD of the remocon.

The invention is in no way limited to the embodiment described hereinabove. Various modifications of disclosed embodiments as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method for establishing a program and time for a remote controller having a microprocessor, comprising the steps of:

performing within a remote controller a time counting operation for one of a plurality of selectable frequencies;

displaying on a visual display of the remote controller representations of time provided by said time counting operation while said time counting operation is being performed under conditions that an initial one of said plurality of frequencies is selected, a functional key is OFF, a mode selection is ON, and an interval of time more than a first period of time goes by after said mode selection is ON; and while not under all of said conditions, performing subroutines at a second one of said frequencies within the remote controller for controlling an appliance, transmitting functional input as data from the remote controller after decoding of the functional input, and transmitting the mode selection input to the appliance as said data from the remote controller for setting an operational mode for the appliance after said mode selection input is displayed throughout the subroutines for setting each program and time.

2. A method according to claim 1 wherein the data transmitted from the remote controller for establishing the main program and time is arranged into groups by regarding the data for the functional input as one group, and a custom code as another group.

3. A method for establishing a program and a time in a remote controller to remotely program an appliance, comprising the steps of:

displaying a time counting operation on a visual display of the remote controller under first conditions that an initial time is established for a first predetermined time, a functional key is OFF and a mode selection key is ON, and thereafter another predetermined time goes by;

decoding a key input and transmitting general keypad input as a set of remote control data under conditions other than said first conditions;

displaying input of said mode selection key on the visual display through performance of each subroutine for setting programs and times for controlling operation of the appliance; and transmitting said set of remote control data for setting operational modes of the appliance, wherein the subroutines are performed with the display function of the visual display monitored and the program is stored to control the appliance.

4. A method according to claim 3, wherein said remote control data from the remote controller for setting the programs and times is divided into a plurality of groups according to the quality of information, where a group corresponds to the data transmitted by the remote controller in response to general keypad input, and a custom code is identically used for each group.

5. A process for setting programs and times in a remote controller able to program an appliance, comprising the steps of:

determining whether a first rate of time or a second rate of time has been selected by a user of a remote controller;

if the first rate of time is determined to have been selected, then making a count of a first interval of time at said first rate;

if the second rate of time is determined to have been selected, then performing a second routine at said second rate, for providing decoded input by decoding keypad input by a user of the remote controller from a keypad of the remote controller;

determining whether a functional key of the keypad is in an ON state, and if the functional key is not in an ON state, then performing said second routine at said second rate, for providing decoded input by decoding keypad input by a user of the remote controller from a keypad of the remote controller;

if the functional key is in an ON state, determining whether a mode setting key is in an ON state;

if the functional key is in an ON state and the mode setting key is not in an ON state, then determining whether a second interval of time has expired and, if said second interval of time has not expired, performing said second routine at said second rate, for providing decoded input by decoding keypad input by a user of the remote controller from a keypad of the remote controller; and if the functional key is in an ON state, the mode setting key is in an ON state, and the second interval of time has expired, then terminating generation of clock signals for said first rate, providing decoded input by decoding keypad input for setting other intervals of time using said second rate, enabling performance of a subroutine for stacking settings, and displaying said count of said first interval on a visual display of the remote controller.

6. The process of claim 5, further comprised of decoding keypad input for setting other intervals of time using said second rate, and enabling performance of a subroutine for stacking settings, after completing said displaying of said count of said first interval on the visual display of the remote controller.

7. The process of claim 5, further comprised of determining whether said keypad input is number keying or sound multi-section keying while decoding said keypad input.

8. The process of claim 6, further comprised of determining whether said keypad input is number keying or sound multi-section keying while decoding said keypad input.

9. The process of claim 5, further comprised of:

after performing said second routine at said second rate, for providing decoded input by decoding keypad input by a user of the remote controller from a keypad of the remote controller, determining whether said mode setting key is in an ON state; and if said mode setting key is not in an ON state, displaying said decoded input on the visual display of the remote controller and transmitting said decoded input to an appliance.

10. The process of claim 5, further comprised of:

after performing said second routine at said second rate, for providing decoded input by decoding keypad input by a user of the remote controller from a keypad of the remote controller, determining whether said mode setting key is in an ON state;

if said mode setting key is in an ON state, determining whether a programming setting key is in an ON state;

if said mode setting key is not in an ON state, displaying said decoded input on the visual display of the remote controller and transmitting said decoded input to an appliance; and if said mode setting key is in an ON state, and if said programming setting key is in an ON state, then performing a third routine by setting a program for controlling operation of the appliance using the remote controller, displaying said decoded input on the visual display of the remote controller and transmitting said decoded input to an appliance.

11. The process of claim 5, further comprised of:

after performing said second routine at said second rate, for providing decoded input by decoding keypad input by a user of the remote controller from a keypad of the remote controller, determining whether said mode setting key is in an ON state;

if said mode setting key is in an ON state, determining whether a programming setting key is in an ON state;

if said mode setting key is not in an ON state, displaying said decoded input on the visual display of the remote controller and transmitting said decoded input to an appliance;

if said mode setting key is in an ON state, and if said programming setting key is in an ON state, then performing a third routine for providing decoded input by decoding keypad input to set a program for controlling operation of the appliance using the remote controller, displaying said decoded input on the visual display of the remote controller and transmitting said decoded input to an appliance; and if said mode setting key is in an ON state, and if said programming setting key is not in an ON state, then performing a fourth routine for providing decoded input by decoding keypad input to set a time for controlling operation of the appliance using the remote controller, displaying said decoded input on the visual display of the remote controller and transmitting said decoded input to an appliance.

12. The process of claim 6, further comprised of:

after performing said second routine at said second rate, for providing decoded input by decoding keypad input by a user of the remote controller from a keypad of the remote controller, determining whether said mode setting key is in an ON state; and if said mode setting key is not in an ON state, displaying said decoded input on the visual display of the remote controller and transmitting said decoded input to an appliance.

13. The process of claim 6, further comprised of:

after performing said second routine at said second rate, for providing decoded input by decoding keypad input by a user of the remote controller from a keypad of the remote controller, determining whether said mode setting key is in an ON state;

if said mode setting key is in an ON state, determining whether a programming setting key is in an ON state;

if said mode setting key is not in an ON state, displaying said decoded input on the visual display of the remote controller and transmitting said decoded input to an appliance; and if said mode setting key is in an ON state, and if said programming setting key is in an ON state, then performing a third routine by setting a program for controlling operation of the appliance using the remote controller, displaying said decoded input on the visual display of the remote controller and transmitting said decoded input to an appliance.

14. The process of claim 6, further comprised of:

after performing said second routine at said second rate, for providing decoded input by decoding keypad input by a user of the remote controller from a keypad of the remote controller, determining whether said mode setting key is in an ON state;

if said mode setting key is in an ON state, determining whether a programming setting key is in an ON state;

if said mode setting key is not in an ON state, displaying said decoded input on the visual display of the remote controller and transmitting said decoded input to an appliance;

if said mode setting key is in an ON state, and if said programming setting key is in an ON state, then performing a third routine for providing decoded input by decoding keypad input to set a program for controlling operation of the appliance using the remote controller, displaying said decoded input on the visual display of the remote controller and transmitting said decoded input to an appliance; and if said mode setting key is in an ON state, and if said programming setting key is not in an ON state, then performing a fourth routine for providing decoded input by decoding keypad input to set a time for controlling operation of the appliance using the remote controller, displaying said decoded input on the visual display of the remote controller and transmitting said decoded input to an appliance.

15. The process of claim 6, further comprised of:

after performing said second routine at said second rate, for providing decoded input by decoding keypad input by a user of the remote controller from a keypad of the remote controller, determining whether said mode setting key is in an ON state;

if said mode setting key is in an ON state, determining whether a programming setting key is in an ON state;

if said mode setting key is not in an ON state, displaying said decoded input on the visual display of the remote controller and transmitting said decoded input to an appliance;

if said mode setting key is in an ON state, and if said programming setting key is in an ON state, then performing a third routine for providing decoded input by decoding keypad input to set a program for controlling operation of the appliance using the remote controller, displaying said decoded input on the visual display of the remote controller and transmitting said decoded input to an appliance; and if said mode setting key is in an ON state, and if said programming setting key is not in an ON state, then performing a fourth routine for providing decoded input by decoding keypad input to set a time for controlling operation of the appliance using the remote controller, displaying said decoded input on the visual display of the remote controller and transmitting said decoded input to an appliance.

* * * * *

UNITED STATES PATENT AND TRADEMARK OFFICE
CERTIFICATE OF CORRECTION

PATENT NO. : 5,117,404
DATED : 26 May 1992
INVENTOR(S) : Byung-Hwan YANG

It is certified that error appears in the above-identified patent and that said Letters Patent is hereby corrected as shown below:

On the Title page, item [57] col. 2,

IN THE ABSTRACT

Line 5, insert --in-- after "is"; and

Line 11, insert --on-- after "display".

Column 1,   Line 23,   insert a comma after "method";

Line 48,   replace "being" with --and--; and

Line 53,   delete "the" (second occurrence).

Column 2,   Line 6,    delete "of";

Line 26,   replace "(1)" with --1--, and delete "1", and insert --(see FIG. 4)-- after "3";

Line 27,   replace "seconds" with --second--;

Line 28,   delete "see FIG. 4)";

Line 50,   replace "expire" with --expired--;

Line 67,   insert --it-- after "if"; and

Line 68,   delete "shown in FIG.".

UNITED STATES PATENT AND TRADEMARK OFFICE
CERTIFICATE OF CORRECTION

PATENT NO. : U.S. 5,117,404
DATED : 26 May 1992
INVENTOR(S) : Byung-Hwan YANG

It is certified that error appears in the above-identified patent and that said Letters Patent is hereby corrected as shown below:

Column 3, Line 1, delete "4", and insert --shown in FIG. 4-- after "subroutine";

Line 4, replace "is that" with --as--;

Line 8, replace "whether on sending of" with --between whether--, and replace "or not remo-" with --has or has not been--; and Line 9, delete "con data is".

Signed and Sealed this

Twenty-first Day of December, 1993

BRUCE LEHMAN

Attest:

Attesting Officer        Commissioner of Patents and Trademarks